(12) United States Patent
Patti

(10) Patent No.: US 7,053,463 B2
(45) Date of Patent: May 30, 2006

(54) HIGH-VOLTAGE INTEGRATED VERTICAL RESISTOR AND MANUFACTURING PROCESS THEREOF

(75) Inventor: Davide Patti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/756,203

(22) Filed: Jan. 12, 2004

(65) Prior Publication Data

US 2004/0183158 A1 Sep. 23, 2004

Related U.S. Application Data

(63) Continuation of application No. 09/733,781, filed on Dec. 7, 2000, now abandoned.

(30) Foreign Application Priority Data

Dec. 10, 1999 (IT) ............................... TO99A1086

(51) Int. Cl.
*H01L 29/00* (2006.01)

(52) U.S. Cl. ...................... 257/536; 257/508; 257/520; 257/543; 257/572

(58) Field of Classification Search ................ 257/508, 257/510, 520, 536, 539, 542, 543, 572
See application file for complete search history.

(56) References Cited

U.S. PATENT DOCUMENTS

| | | | | |
|---|---|---|---|---|
| 3,982,263 A | * | 9/1976 | Dobkin | 257/261 |
| 4,896,243 A | | 1/1990 | Chatterjee et al. | 362/91 |
| 4,933,739 A | * | 6/1990 | Harari | 257/621 |
| 5,122,846 A | * | 6/1992 | Haken | 257/66 |
| 5,229,310 A | * | 7/1993 | Sivan | 438/156 |
| 5,304,838 A | * | 4/1994 | Ozawa | 257/542 |
| 5,373,183 A | * | 12/1994 | Beasom | 257/487 |
| 5,408,124 A | * | 4/1995 | Palara | 257/580 |
| 5,696,396 A | * | 12/1997 | Tokura et al. | 257/341 |
| 5,825,067 A | * | 10/1998 | Takeuchi et al. | 257/355 |
| 5,949,122 A | | 9/1999 | Scaccianoce | 257/469 |
| 6,030,898 A | * | 2/2000 | Liu | 438/692 |
| 6,373,100 B1 | | 4/2002 | Pages et al. | 257/343 |
| 6,696,916 B1 | * | 2/2004 | Sanfilippo et al. | 338/309 |

FOREIGN PATENT DOCUMENTS

| | | |
|---|---|---|
| JP | 61-232657 | 10/1986 |
| JP | 6-342878 | 12/1994 |
| JP | 06342878 A * | 12/1994 |

* cited by examiner

*Primary Examiner*—Tom Thomas
*Assistant Examiner*—Matthew E. Warren
(74) *Attorney, Agent, or Firm*—Lisa K. Jorgenson; Robert Iannucci; Seed IP Law Group PLLC

(57) ABSTRACT

The manufacturing process comprises the steps of growing epitaxially a first layer from a semiconductor material substrate, forming in the first layer a first and a second buried region spaced from one another and having conductivity of the type opposite that of the first layer; growing epitaxially on the first layer a second layer of semiconductor material having the same type of conductivity as the first layer; forming in the second layer a trench extending in depth beyond the buried regions, arranged between the buried regions, and having, in plan view, a frame shape; forming an oxide layer covering the lateral walls and the base wall of the trench; and filling the remaining part of the trench with an isolating material. By this means, the portion of the second layer surrounded by the trench defines a first high-voltage resistor having a vertical structure and current flow, whereas the portion of the first layer arranged below the trench defines a second high-voltage resistor arranged in series with the first high-voltage resistor, and also having a vertical structure and current flow.

23 Claims, 5 Drawing Sheets

HIGH-VOLTAGE INTEGRATED VERTICAL RESISTOR AND MANUFACTURING PROCESS THEREOF

This application is a continuation of 09/733,781 filed on Dec. 7, 2000 which is now abandoned.

TECHNICAL FIELD

The present invention relates to a high-voltage integrated vertical resistor and to a manufacturing process thereof.

The present invention can advantageously, but not exclusively, be applied in the manufacture of high-voltage resistors integrated in a semiconductor material body together with power devices, to which the following description refers, without however detracting from generality.

BACKGROUND OF THE INVENTION

As is known, high-voltage resistors integrated on a semiconductor material substrate are used extensively in the field of integrated monolithic power devices, for example devices manufactured using VIPower technology, according to which the power devices are integrated in a first chip region, known as the power region, whereas the corresponding control devices are integrated in a second chip region, which is known as the control region, and is separated and electrically isolated from the power region.

In addition, in some applications, it is also necessary to have available within the control region a biasing voltage which is branched from the biasing voltage of the substrate, by means of a partition provided using a resistor connected between the substrate and the control region.

However, in order for this resistor to be able to withstand the high values (up to 2 kV) which, as is known, the biasing voltage of the substrate can reach, it must have somewhat high resistance values which generally vary between 100 kΩ and a few MΩ.

A solution which is commonly used to manufacture a resistor having the above-described resistance values consists of forming on the semiconductor substrate a doped region with high resistivity and having conductivity opposite that of the semiconductor substrate, and a flat coil pattern.

Although it is advantageous in various respects, this solution has the disadvantage that it requires a somewhat large surface area, owing mainly to the fact that, in order to prevent malfunctioning of the resistor, the minimum distance which must be maintained between two adjacent parallel branches of the coil resistor cannot be reduced as required, but depends on the concentration of doping agent present in the substrate, and on the voltage across the resistor.

In fact, as is known, when the junction formed by the substrate and the resistor is biased inversely, the size of the depletion or space-charge region which consequently extends in the substrate, is inversely proportional to the concentration of doping agent in the substrate, i.e., it is directly proportional to the resistivity of the substrate.

Consequently, although the high-voltage resistor can be integrated using the most resistive layers available in the technique, devices manufactured using VIPower technology and able to withstand high voltages, have necessarily high resistivity in the substrate, of several orders of magnitude greater than the most resistive layers available according to the present technological processes, and thus, the size of the depletion region extending in the substrate has somewhat large dimensions, of approximately tens of microns, when high differences of potential are applied.

From the foregoing, it is apparent that, in order to prevent the depletion regions of two adjacent parallel branches of the coil resistor from coming into contact, and giving rise to the known pinch-off phenomenon, thus giving rise to deterioration of the resistance value of the resistor, and therefore of the functionality of the circuitry to which this resistor is connected, during the design stage it is necessary to space each pair of adjacent parallel branches of the coil resistor, by a value which is greater than the sum of the maximum widths of the depletion region applicable for each branch.

In order to reduce the depletion region present between the various branches, a known solution consists of enriching the layer designed for integration of the resistor. However, this solution reduces the breakdown voltage of the device, since, in order to be able to obtain the required reduction of the depletion region, it would be necessary to have an extremely high concentration of doping agent.

The aforementioned large surface area of the coil resistor is also caused secondarily by the fact that the presence of high voltages on the resistor requires the formation of so-called edge structures which can protect against phenomena of premature breakdown of the regions of the resistor subjected most to the high voltages. In fact, for example, for this purpose, so-called metal field plates are formed, i.e., annular regions with high resistivity (low concentration of doping agent) and surrounding the coil resistor.

A further effect which contributes towards making the surface area of resistors of the above-described type large, is their interaction with the edge structures of the devices in which they are used, and the consequent necessity to arrange this resistor in the vicinity of the terminal region of the device from which the high voltage is obtained.

In order to reduce the depletion region present between the various branches of the coil resistor, a solution proposed recently, which is the subject of European Patent application 98830638.7 filed on Oct. 23, 1998, by the same applicant, consists of forming the coil resistor using a semiconductor material layer with high resistivity and having conductivity opposite that of the substrate, and, between each pair of adjacent parallel branches of the coil resistor, forming one or more isolation trenches, for example formed of silicon dioxide, extending in depth further into the substrate than the semiconductor material layer from which the coil resistor is formed, by an extent sufficient to prevent the pinch-off phenomenon from occurring.

However, also in this solution, the coil resistor is arranged close to the terminal region of the device from which the high voltage is obtained, and consequently the reduction of the surface area is relatively small, and there still exists the disadvantage caused by the interaction of the resistor with the edge structures of the device in which this resistor is formed.

SUMMARY OF THE INVENTION

An embodiment of the present invention provides a high-voltage resistor and a manufacturing process thereof which make it possible to eliminate the above-described disadvantages.

An embodiment of the invention is directed to an integrated device that includes a resistor with a vertical current flow structure. The integrated device includes a semiconductor body having a surface; a doped semiconductor region extending longitudinally into the semiconductor body from the surface; and an insulating region extending longitudinally into the semiconductor body from the surface. The insulating region laterally surrounds the semiconductor region to laterally insulate the semiconductor region from electronic devices positioned laterally of the insulating region. Accordingly, the semiconductor region is the resistor and extending transversely with respect to the surface of the semiconductor body.

BRIEF DESCRIPTION OF THE DRAWINGS

In order to assist understanding of the present invention, some preferred embodiments are now described, purely by way of non-limiting example, and with reference to the attached drawings, in which.

DETAILED DESCRIPTION OF THE INVENTION

Figure 1:
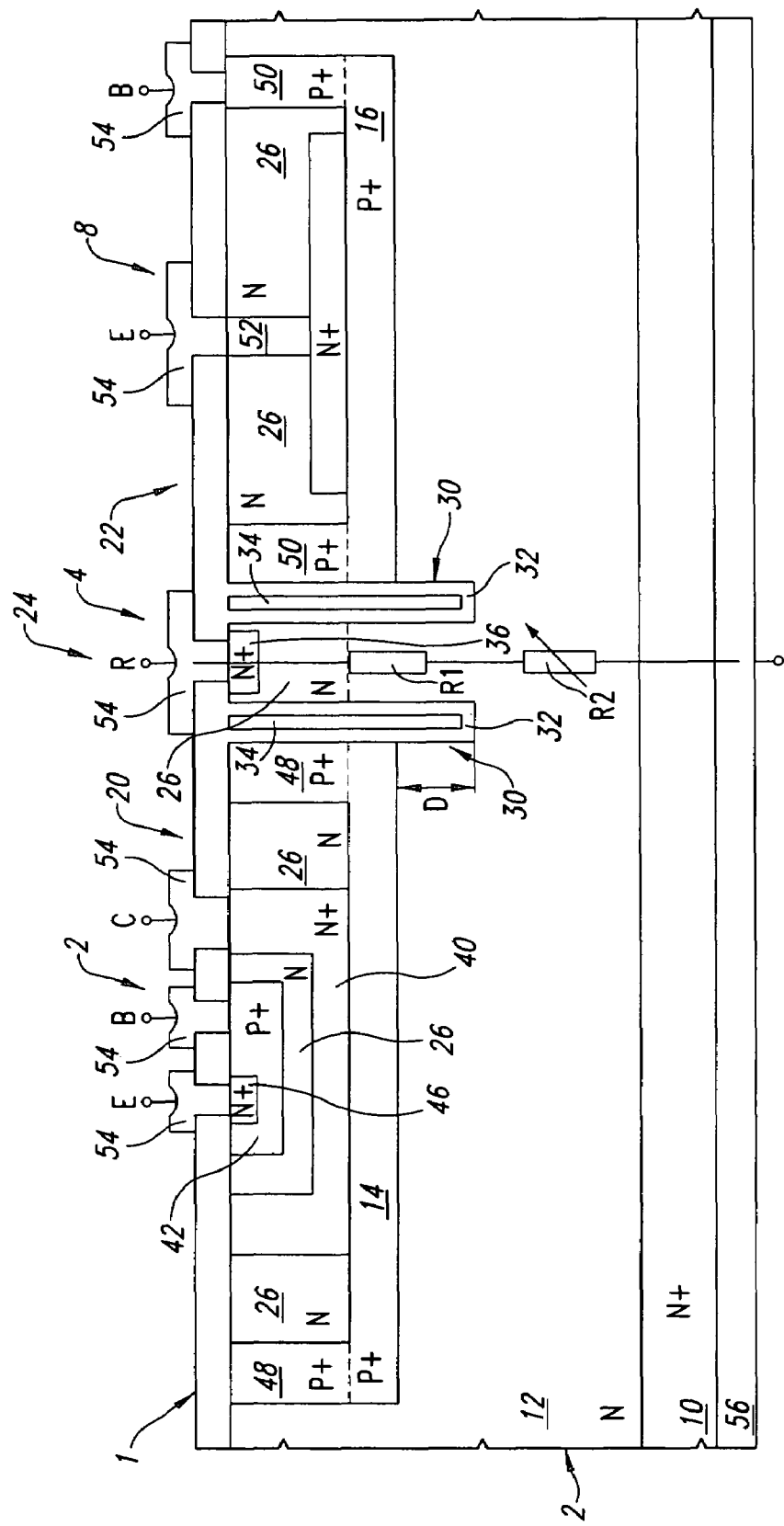
FIG. 1 shows a schematic transverse cross-section of a semiconductor material body in which there is provided a high-voltage vertical resistor according to a first embodiment of the present invention.
Figure 2:
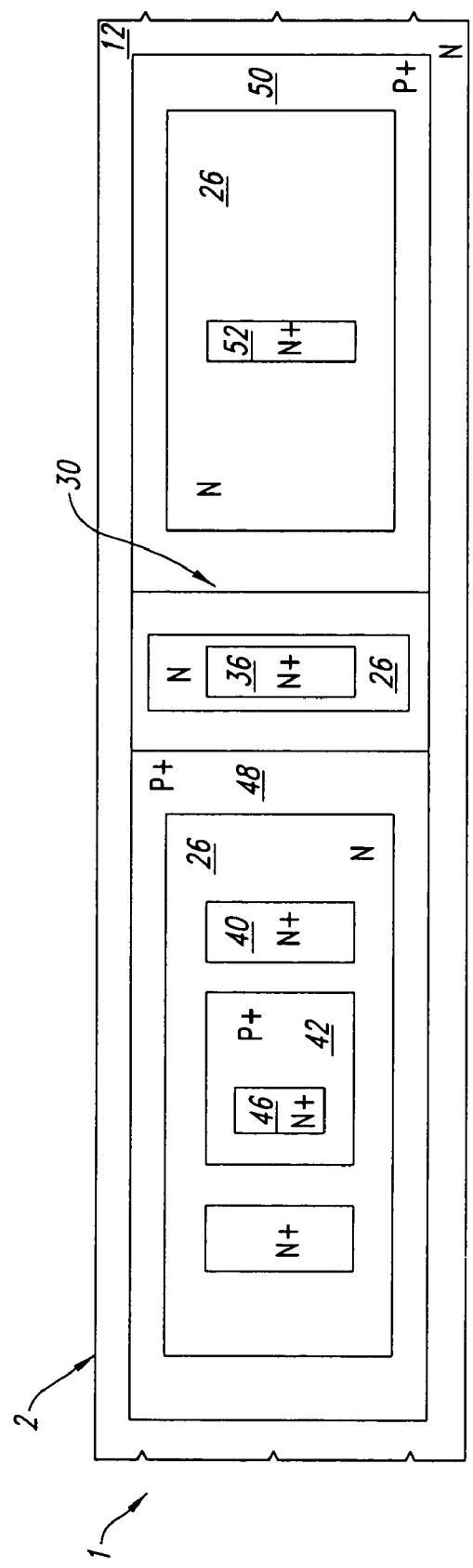
FIG. 2 is a schematic plan view of the semiconductor material body in FIG. 1.

In FIGS. 1 and 2, 1 indicates as a whole a device integrated in a semiconductor material body 2 and comprising a resistor 4 according to a first embodiment of the present invention, and, purely by way of non-limiting example, a control transistor 6 with a horizontal structure, and a power transistor 8 with a vertical structure.

In particular, in order to manufacture the resistor 4, the control transistor 6 and the power transistor 8, on a substrate 10 of monocrystalline silicon with a high concentration of doping impurities of type $N^+$, there is initially grown a first epitaxial layer 12 having a thickness and a concentration of impurities selected according to the maximum voltage which the resistor 4 must be able to withstand; typically, the concentration of the impurities present in the epitaxial layer 12 varies between $10^{13}$ and $10^{14}$ atoms/cm$^3$, whereas the thickness of the epitaxial layer 12 is generally between 60 and 120 μm.

Then, by means of ionic implantation and a subsequent diffusion process, a first and a second buried region 14, 16 of type $P^-$ are formed on the first epitaxial layer 12. In particular, the first buried region 14 is formed in a control area 20 of the semiconductor material body 2 in which the control transistor 6 is arranged, whereas the second buried region 16 is formed in a power area 22 of the semiconductor material body 2 in which the power transistor 8 is arranged.

The power area 22 is spaced from the control area 20, and together with the control area 20, delimits an intermediate area 24, which is thus arranged between the control area 20 and the power area 22, and in which the resistor 4 according to the present invention is formed.

On the control area 20, the power area 22 and the intermediate area 24, there is then grown a second epitaxial layer 26 of type N and having a thickness of between 2 and 10 μm.

At the intermediate area 24, using known photolithography and selective chemical etching techniques, for example the known technique of plasma etching, there is then formed in the second epitaxial layer 26 a trench 30, extending in depth beyond the buried regions 14, 16, and having, in plan view, a closed annular shape, which in this case is shown in FIG. 2 in the shape of a rectangular frame, and for example has a width of 1–3 μm and a depth of 10–100 μm.

An oxidation step is then carried out in order to form an oxide layer 32 covering the lateral walls and the base wall of the trench 30, and having a thickness which depends on the electrical performance levels required from the integrated device 1, for example of between 200 and 500 nm.

Subsequently, the trench 30 is completely filled with an isolating filler material 34. Alternatively, the oxidation step could also have a duration such as to form an oxide layer which fills the trench 30 completely.

At the upper surface of the portion of the second epitaxial layer 26 surrounded by the trench 30, by means of ionic implantation, there is then formed a region 36 of type $N^+$ with low resistivity, which is used to form a low-resistivity contact of the resistor 4.

The trench 30 thus formed is arranged between the control area 20 and the power area 22, and surrounds portions of the first and second epitaxial layer 12, 26, which define the resistor 4.

In particular, the resistor 4 has a structure and a current flow which are totally vertical, a resistance which depends on the volume of semiconductor material which is surrounded by the trench 30, and electrical behaviour which depends on the depth of the trench 30, and more particularly depends on the distance D between the base wall of the trench 30 and the PN junctions which the buried regions 14, 16 define with the first epitaxial layer 12.

In particular, the electrical behaviour of the resistor 4 can be controlled during formation of the trench 30 using a known physical phenomenon which is associated with the technique of plasma etching, and has hitherto been considered as a "deficiency" of plasma etching, which makes it possible to form trenches in the silicon at different depths, by varying only the area of silicon to be removed. To give an example, by means of a single photo-masking operation, it is possible to obtain trenches having an opening of 1.0 μm and a depth of 10 μm, and trenches having an opening of 3.0 μm and a depth of 20 μm.

In particular, the resistor 4 can be modellized substantially to comprise a fixed component and a variable component, shown in FIG. 1 as a thin line, in the form of two resistors R1 and R2 connected in series. The fixed component is defined by the volume of semiconductor material contained by the trench 30, whereas the variable component is defined by the "useful" volume of semiconductor material present below the trench 30, i.e., by the volume which has not been depleted of majority carriers from the depletion region, which extends in the epitaxial layer 12 below the trench 30, and is caused by the inverse biasing of the PN junctions which the buried regions 14, 16 define with the first epitaxial layer 1.

By this means, the resistor 4 has a mixed behaviour depending on the biasing voltage of the substrate, and the threshold for change of behaviour can be controlled by controlling the depth of the trench 30. In particular, the resistor 4 has linear behaviour for low substrate biasing voltages, i.e., for which the depletion region does not invade the area of substrate below the trench 30, and thus the resistance of the resistor R2 does not vary, and behaviour of the JFET type for high substrate biasing voltages, i.e., for which the depletion region invades the area of the substrate below the trench 30, and thus the resistance of the resistor R2 varies until it assumes a maximum value when the pinch-off occurs.

During manufacture of the resistor 4, in the control area 20 and in the power area 22, the control transistor 6 and the power transistor 8 are also manufactured.

In particular, as shown in FIGS. 1 and 2, in the control area 20, inside the second epitaxial layer 26, in a manner which is known and is thus not described in detail, there are formed the collector region 40 of type N$^+$ of the control transistor 6, the base region 42 of type P$^+$, which is separated from the collector region 40 by a portion of the epitaxial layer 26, and, inside the base region 42, the emitter region 46 of type N$^+$. In the second epitaxial layer 26, there is also provided a region 48 of type P$^+$, which is formed along a perimeter area of the second epitaxial layer 26, and extends in depth as far as the first buried region 14, and which forms together with the latter a single region of type P$^+$.

On the other hand, in the power area 22, inside the second epitaxial layer 26, there is formed a region 50 of type P$^+$, which is identical to the region 48, and defines the base region of the power transistor 8, and a region 52 of type N$^+$, which defines the emitter region of the power transistor 8, the collector region of which is on the other hand constituted by the first epitaxial layer 12.

Subsequently, using known photolithographic and depositing techniques, there are formed on the upper surface of the semiconductor material body 2 the electrical contacts and the electrodes associated with the latter, indicated as a whole as 54, of the resistor 4, the control transistor 6 and the power transistor 8, whereas on the lower surface of the semiconductor material body 2, there is formed a layer of metallization 56, which constitutes both the second electrode of the resistor 4, and the collector terminal of the power transistor 8.

The advantages which the resistor 4 makes it possible to obtain, are apparent from examination of its characteristics.

Firstly, the resistor 4 can be integrated in any portion of an integrated power device, including inside the area occupied by an elementary component, thus preventing problems relating to interaction with the edge structures of the device, and in order to manufacture it, additional layers are not required, since use is made of the layers which are already present in the process sequence of the power device.

Since the resistor 4 has a completely vertical structure, it occupies a space which is considerably reduced in comparison with that of the resistors produced according to the known art, since it is surrounded by a trench, the overall width of which can vary between 1 and 3 μm.

In addition, the resistor 4 has a single low-voltage electrode arranged on the upper surface, whereas the high-voltage electrode consists of the substrate, which has the electrical contact arranged on the rear of the semiconductor material body 2.

In addition, the resistor 4 has the same conductivity as that of the substrate in which it is formed, unlike the case according to the known art, in which, as initially described, the coil structure is formed with conductivity opposite that of the substrate in which it is formed.

This further difference from the resistors manufactured according to the known art means that in the resistor 4, there is no longer present a depletion region caused by the inverse biasing of the PN junction which it forms together with the substrate, and this gives rise to a considerable reduction in the associated parasitic effects (and which in general can be modelled with parasitic capacitance), which in turn provides the resistor with real ohmic behaviour which is closer to an ideal ohmic behaviour than is the case for the resistors manufactured according to the known art.

According to a further aspect of the present invention, in the portions of semiconductor material surrounded by the trench 30, it is also possible to form other elementary components with a vertical structure, arranged in series with the resistor 4, which make it possible to obtain more complex operating modes.

Figure 3:
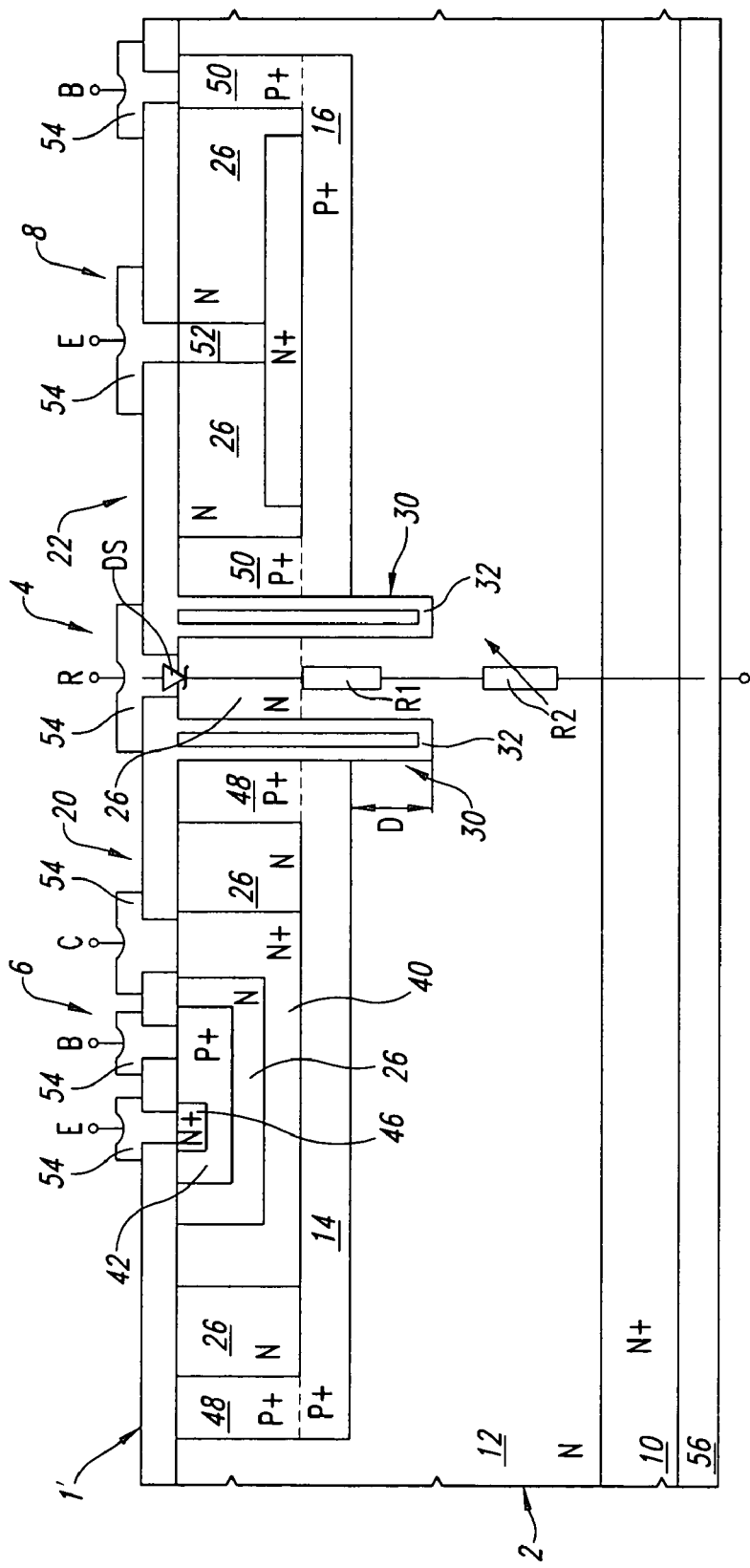
FIG. 3 shows a schematic transverse cross-section of a semiconductor material body in which there is provided a high-voltage vertical resistor according to a second embodiment of the present invention.
Figure 4:
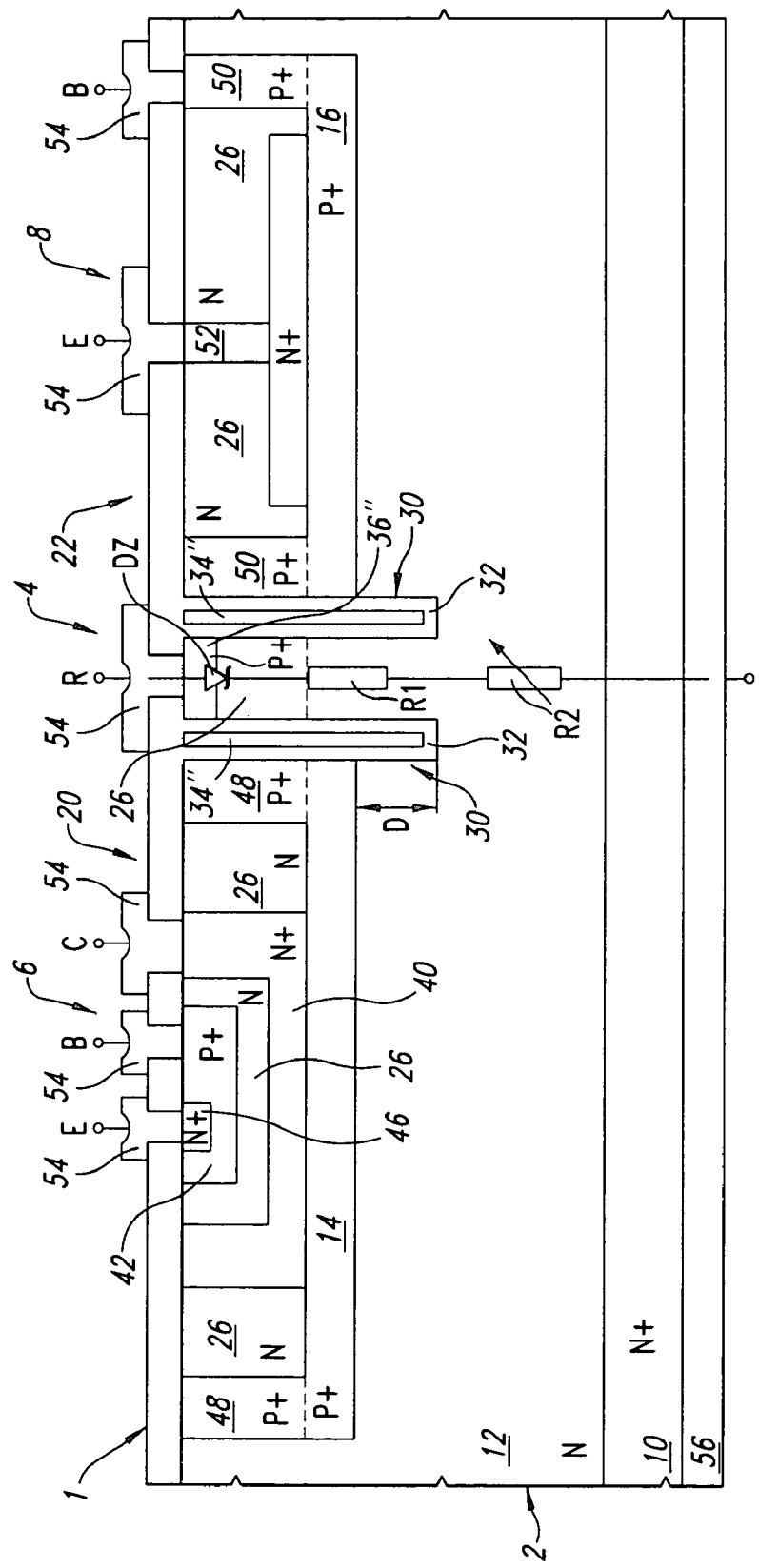
FIG. 4 shows a schematic transverse cross-section of a semiconductor material body in which there is provided a high-voltage vertical resistor according to a third embodiment of the present invention.
Figure 5:
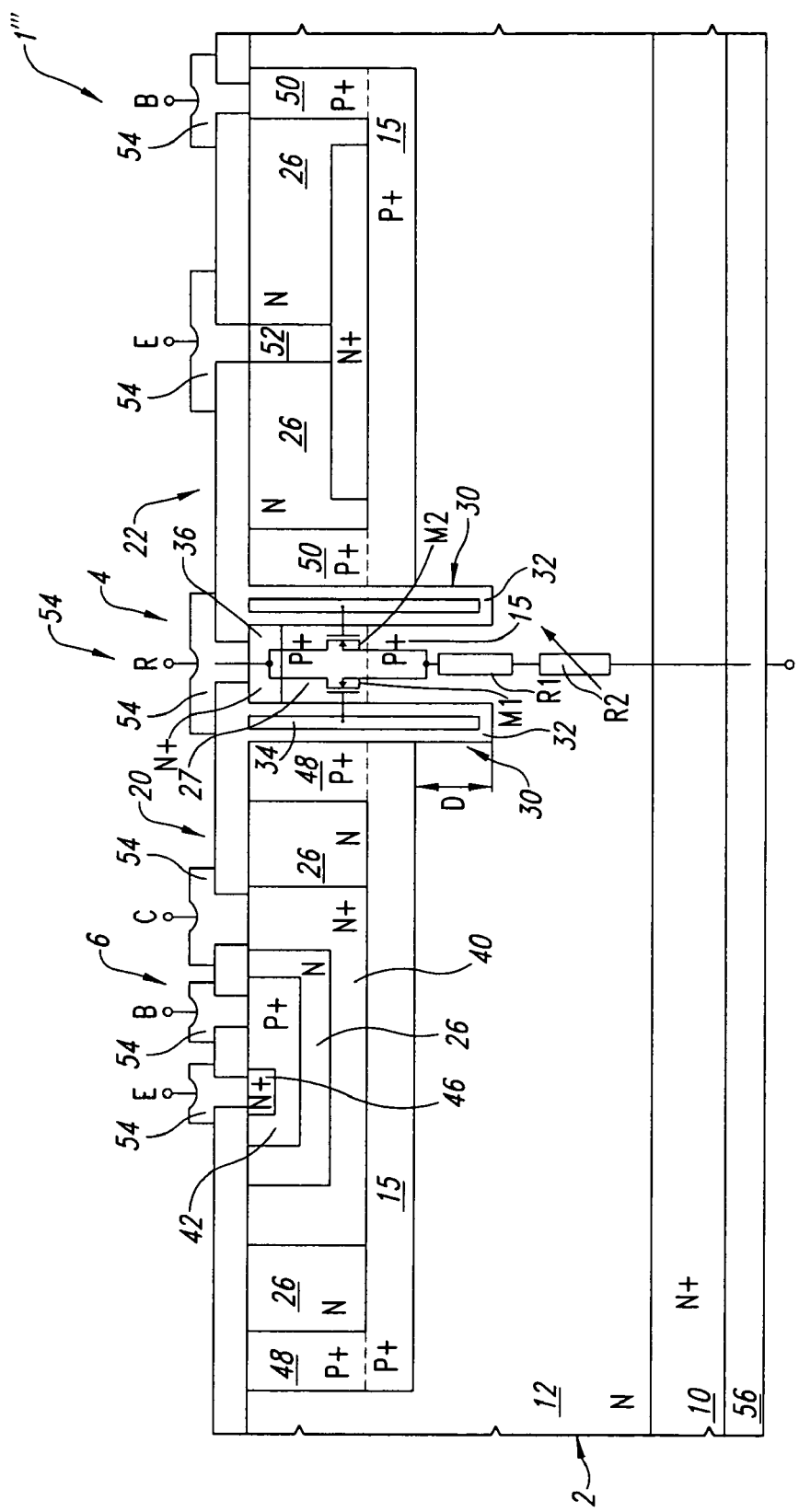
FIG. 5 shows a schematic transverse cross-section of a semiconductor material body in which there is provided a high-voltage vertical resistor according to a fourth embodiment of the present invention.

Some examples are shown in FIGS. 3–5. In particular, FIG. 3 shows an integrated device, indicated as 1', the substantial parts of which are identical to the integrated device 1, and which differs from the latter only in that it does not comprise the area 36 with low resistivity provided in the intermediate area 24, on the upper surface of the second epitaxial layer 26.

By this means, the metal semiconductor junction defined firstly by the metal contacts, and secondly by the second epitaxial layer 26, forms a Schottky diode, which is shown as a thin line and is indicated as DS, connected in series to the resistors R1 and R2.

On the other hand FIG. 4 shows an integrated device, indicated as 1", the substantial parts of which are identical to the integrated device 1, and which differs from the latter only in that the region with low resistivity which is provided in the intermediate area 24 on the upper surface of the second epitaxial layer 26, and is indicated in this case as 36", has conductivity opposite that of the second epitaxial layer 26, and in particular conductivity of type P$^+$.

By this means, the region 36" with low resistivity and the second epitaxial layer 26 form a Zener diode, which is shown as a thin line and is indicated as DZ, connected in series to the resistors R1 and R2, and which, with its characteristic breakdown, determines the threshold of intervention of the resistors R1 and R2.

Finally, FIG. 5 shows an integrated device, indicated as 1''', the substantial parts of which are identical to the integrated device 1, and which differs from the latter in that:

the filler material for the trench 30, indicated here as 34''', is of the conductive type, for example doped polysilicon;

instead of the two buried regions 14, 16 there is a single continuous buried region, indicated in FIG. 5 as 15, which is formed by means of a single ionic implantation and diffusion and is then interrupted by the trench 30, such that a portion is surrounded by the trench 30; and in the portion of the second epitaxial layer which is surrounded by the trench 30, there is formed a region, indicated as 27, which has conductivity opposite that of the first epitaxial layer 12 and of the region 36 with low resistivity, in this case of type P$^+$, and which occupies completely the volume between the region 36 and the buried region 15.

By this means, the region 36, the region 27, the oxide layer 32, the filler material 34 and the buried region 15 define a pair of MOSFET transistors, shown in FIG. 5 as a thin line and indicated as M1 and M2, connected in the manner illustrated in FIG. 5, and the channel region of which is formed by the region 27.

When they are switched on, the MOSFET transistors M1, M2 make it possible to control not only the threshold of intervention of the resistor 4, but also the flow of current which passes through the latter.

Finally, it is apparent that modifications and variants can be made to the production process described and illustrated here, without departing from the protective scope of the present invention.

For example, in the case of devices in which formation of the control transistor 6 and the power transistor is not required, the buried regions 14, 16 and the second epitaxial layer 26 can be omitted, and thus the trench 30 can be formed directly in the first epitaxial layer 12.

In addition, the substrate 10 and the first epitaxial layer 12 can be replaced by a single substrate of the float zone type, which has a profile with concentration which decreases from the lower surface towards the upper surface of the substrate, on which either the resistor according to the invention can be formed, or the second epitaxial layer 26 can be grown.

In addition, in the integrated device 1''' according to the third embodiment of the present invention, the region 27 having conductivity P$^+$ could also be omitted, and thus the channel of the MOSFET transistors M1 and M2 could be formed by the portion of the second epitaxial layer 26, as well as the region 36 with low resistivity, such as to form a Schottky diode.

I claim:

1. An integrated device comprising:
   a high-voltage resistor integrated in a semiconductor material body wherein said high-voltage resistor has a vertical current flow structure, wherein said high-voltage resistor is formed by a portion of said semiconductor material body extending between a first and a second surface of the semiconductor material body, and delimited at least partially by an insulation region extending from said first surface towards said second surface of said semiconductor material body, wherein the insulating region includes:
   insulating material that contacts the high-voltage resistor;
   first and second insulating walls extending into the semiconductor material body from the first surface toward the second surface;
   a first conductive filler that is laterally surrounded by the first and second insulating walls;
   third and fourth insulating walls extending into the semiconductor material body from the first surface toward the second surface; and
   a second conductive filler that is laterally surrounded by the third and fourth insulating walls;
   a first semiconductor region that is defined on a first side by the second insulating wall and on a second side by the third insulating wall, the first semiconductor region having a first conductivity type; and
   a second semiconductor region that is defined on a first side by the second insulating wall and on a second side by the third insulating wall; the second semiconductor region having a second conductivity type, being positioned below the first semiconductor region, and including the resistor.

2. An integrated device according to claim 1 wherein said high-voltage resistor has conductivity of the same type as that of said semiconductor material body.

3. An integrated device according to claim 1 wherein said insulation region has a closed shape in plan view.

4. An integrated device according to claim 1 wherein said insulation region is formed entirely of dielectric material.

5. An integrated device according to claim 1, further comprising a first and a second region having conductivity opposite that of said semiconductor material body, and arranged on opposite sides of said insulation region.

6. An integrated device according to claim 1, further comprising first and second electronic devices formed in said semiconductor material body on opposite sides of said insulation region.

7. The device of claim 1 wherein the resistor is a doped semiconductor region of the body that is laterally surrounded by the insulating region, which extends longitudinally into the body from the first surface of the body, the insulating region including insulating walls made of electrically insulating material and a conductive filler that is laterally surrounded by the insulating walls.

8. The device of claim 1 wherein the semiconductor region includes an upper region of a first conductivity type; a middle region of a second conductivity type, opposite to the first conductivity type; and a lower region of the first conductivity type, the middle region being positioned between the upper and lower regions such that a transistor is formed that includes the conductive filler as a gate, the upper region as a first source/drain, and the lower region as a second source/drain, wherein the upper, middle, and lower regions are laterally surrounded by the insulating walls.

9. The device of claim 1, further comprising:
   a third semiconductor region that is defined on a first side by the second insulating wall and on a second side by the third insulating wall, the third semiconductor region having the second conductivity type and being positioned above the first semiconductor region; wherein the first conductive filler, the first semiconductor region, and the third semiconductor regions are respectively a gate, first source/drain, and second source/drain of a first vertical transistor; and the second conductive filler, the first semiconductor region, and the third semiconductor regions are respectively a gate, first source/drain, and second source/drain of a second vertical transistor.

10. An integrated device, comprising:
    a semiconductor body having a surface;
    a doped semiconductor region extending longitudinally into the semiconductor body from the surface, the semiconductor region including a resistor extending transversely with respect to the surface; and
    an insulating region extending longitudinally into the semiconductor body from the surface, the insulating region laterally surrounding the semiconductor region, wherein the insulating region includes insulating material that contacts the resistor, wherein the semiconductor region includes an upper region adjacent to the surface of the semiconductor body and a lower region positioned below the upper region, the upper region having a conductivity type opposite to a conductivity type of the lower region, thereby forming a diode above the resistor.

11. The device of claim 10 wherein the insulating region is open at a bottom portion such that the semiconductor region is contiguous with the semiconductor body.

12. The device of claim 10 wherein the semiconductor region has a rectangular cross-section and the insulating region has a rectangular frame shape.

13. The device of claim 10 wherein the insulating region is completely of electrically isolating material.

14. The device of claim 10 wherein the insulating region includes insulating walls made of electrically insulating material and a conductive filler that is laterally surrounded by the insulating walls.

15. An integrated device, comprising:
a semiconductor body having a surface;
a doped semiconductor region extending longitudinally into the semiconductor body from the surface, the semiconductor region including a resistor extending transversely with respect to the surface; and
an insulating region extending longitudinally into the semiconductor body from the surface, the insulating region laterally surrounding the semiconductor region, wherein the insulating region includes insulating material that contacts the resistor, wherein the insulating region includes insulating walls made of electrically insulating material and a conductive filler that is laterally surrounded by the insulating walls, wherein the semiconductor region includes an upper region of a first conductivity type; a middle region of a second conductivity type, opposite to the first conductivity type; and a lower region of the first conductivity type, the middle region being positioned between the upper and lower regions such that a transistor is formed that includes the conductive filler as a gate, the upper region as a first source/drain, and the lower region as a second source/drain, wherein the upper, middle, and lower regions are laterally surrounded by the insulating walls.

16. The device of claim 10, further comprising first and second semiconductor regions having conductivity opposite to a conductivity of the semiconductor material body, and arranged immediately adjacent to opposite sides of the insulation region.

17. The device of claim 10 wherein the semiconductor region includes an upper region adjacent to the surface of the semiconductor body and a lower region positioned below the upper region, the upper region being doped at a higher doping level compared to the lower region.

18. The device of claim 10 wherein the insulating region includes:
first and second insulating walls extending into the semiconductor body from the surface;
a first conductive filler that is laterally surrounded by the first and second insulating walls;
third and fourth insulating walls extending into the semiconductor material body from the surface; and
a second conductive filler that is laterally surrounded by the third and fourth insulating walls.

19. An integrated device comprising:
a semiconductor body having a surface;
a doped semiconductor region extending longitudinally into the semiconductor body from the surface, the semiconductor region including a resistor extending transversely with respect to the surface; and
an insulating region extending longitudinally into the semiconductor body from the surface, the insulating region laterally surrounding the semiconductor region, wherein the insulating region includes insulating material that contacts the resistor, wherein the insulating region includes:
first and second insulating walls extending into the semiconductor body from the surface;
a first conductive filler that is laterally surrounded by the first and second insulating walls;
third and fourth insulating walls extending into the semiconductor material body from the surface; and
a second conductive filler that is laterally surrounded by the third and fourth insulating walls, wherein the doped semiconductor region includes:
a first semiconductor region that is defined on a first side by the second insulating wall and on a second side by the third insulating wall, the first semiconductor region having a first conductivity type; and
a second semiconductor region that is defined on a first side by the second insulating wall and on a second side by the third insulating wall; the second semiconductor region having a second conductivity type, being positioned below the first semiconductor region, and including the resistor.

20. The device of claim 19, wherein the doped semiconductor region includes:
a third semiconductor region that is defined on a first side by the second insulating wall and on a second side by the third insulating wall, the third semiconductor region having the second conductivity type and being positioned above the first semiconductor region; wherein the first conductive filler, the first semiconductor region, and the third semiconductor regions are respectively a gate, first source/drain, and second source/drain of a first vertical transistor; and the second conductive filler, the first semiconductor region, and the third semiconductor regions are respectively a gate, first source/drain, and second source/drain of a second vertical transistor.

21. An integrated circuit, comprising:
a semiconductor body having a surface;
a first insulating trench extending into the semiconductor body from the surface;
a second insulating trench extending into the semiconductor material body from the surface;
a first semiconductor region that is defined on a first side by the first insulating trench and on a second side by the second insulating trench, the first semiconductor region having a first conductivity type; and
a second semiconductor region that is defined on a first side by the first insulating trench and on a second side by the second insulating trench; the second semiconductor region being positioned below the first semiconductor region, having a second conductivity type, being continuous with a portion of the semiconductor body that is below the insulating trenches, and including a resistor extending transversely with respect to the surface.

22. The integrated circuit of claim 21 wherein the first insulating trench includes:
first and second insulating walls extending into the semiconductor body from the surface; and
a first conductive filler that is laterally surrounded by the first and second insulating walls; wherein the second insulating trench includes:
third and fourth insulating walls extending into the semiconductor material body from the surface; and
a second conductive filler that is laterally surrounded by the third and fourth insulating walls.

23. The device of claim 22, further comprising:
a third semiconductor region that is defined on a first side by the second insulating wall and on a second side by the third insulating wall, the third semiconductor region having the second conductivity type and being positioned above the first semiconductor region; wherein the first conductive filler, the first semiconductor region, and the third semiconductor regions are respectively a gate, first source/drain, and second source/drain of a first vertical transistor; and the second conductive filler, the first semiconductor region, and the third semiconductor regions are respectively a gate, first source/drain, and second source/drain of a second vertical transistor.

* * * * *